United States Patent
Mitsui et al.

(10) Patent No.: US 7,595,993 B2
(45) Date of Patent: Sep. 29, 2009

(54) MOUNTING STRUCTURE WITH HEAT SINK FOR ELECTRONIC COMPONENT AND FEMALE SECURING MEMBER FOR SAME

(76) Inventors: Tomoyuki Mitsui, c/o NEC Corporation, 7-1, Shiba 5-chome, Minato-ku, Tokyo (JP); Masahiro Nakashima, c/o NEC Corporation, 7-1, Shiba 5-chome, Minato-ku, Tokyo (JP)

( * ) Notice: Subject to any disclaimer, the term of this patent is extended or adjusted under 35 U.S.C. 154(b) by 30 days.

(21) Appl. No.: 12/042,951

(22) Filed: Mar. 5, 2008

(65) Prior Publication Data
US 2008/0218975 A1   Sep. 11, 2008

(51) Int. Cl.
*H05K 7/20* (2006.01)
(52) U.S. Cl. .............. 361/719; 361/704; 361/707; 257/706; 257/718; 257/719; 165/80.3; 165/185
(58) Field of Classification Search ............ None
See application file for complete search history.

(56) References Cited

U.S. PATENT DOCUMENTS 5,648,890 A * 7/1997 Loo et al. ............... 361/704
6,055,159 A * 4/2000 Sun ......................... 361/704
7,019,979 B2 * 3/2006 Wang et al. ............. 361/719
7,142,422 B2 * 11/2006 Lee et al. ................ 361/695
7,193,851 B2 * 3/2007 Yatskov .................. 361/710
7,428,154 B2 * 9/2008 Ishimine et al. ........ 361/704

FOREIGN PATENT DOCUMENTS

| JP | 09139450 A | 5/1997 |
| JP | 2000058703 A | 2/2000 |
| JP | 2001057405 A | 2/2001 |

* cited by examiner

*Primary Examiner*—Boris L Chervinsky

(57) ABSTRACT

A mounting structure is provided which is capable of easily attaching a heat sink irrespective of a thickness of an LSI (Large-Scale Integration circuit) mounted on a printed circuit board. Each female screw metal fitting of each female screw portion is attached on an upper surface of a cylindrical gel in a stacked manner and a lower surface of the cylindrical gel is attached to the printed circuit board. An end portion of each male screw is made to pass through each through-hole of the heat sink so as to be screwed into each of the female screw portions. With a progress of screwing therein, each of the female screw portions is elevated and the cylindrical gel is pulled and elongated. Since a restoring force occurs when the cylindrical gel is elongated, the heat sink is pulled by each of the female screw portions toward the LSI. Thus, variations in height can be accommodated.

16 Claims, 7 Drawing Sheets

MOUNTING STRUCTURE WITH HEAT SINK FOR ELECTRONIC COMPONENT AND FEMALE SECURING MEMBER FOR SAME

INCORPORATION BY REFERENCE

This application is based upon and claims the benefit of priority from Japanese Patent Application No. 2007-061041, filed on Mar. 9, 2007, the disclosure of which is incorporated herein in its entirely by reference.

BACKGROUND OF THE INVENTION

1. Field of the Invention

The present invention relates to a mounting structure with a heat sink for electronic component and securing members for the mounting structure and more particularly to the mounting structure with the heat sink for at least one electronic component suitably used for electronic components such as an LSI (Large Scale Integration) circuit whose temperature rises at a time of operations and the securing member suitably used for the mounting structure.

2. Description of the Related Art

Conventionally, a heat sink of this kind is used for suppressing a temperature rise caused by power consumed when an LSI in a package is operating by being in thermal contact with the LSI surface-mounted or insertion-mounted on a printed circuit board. When the heat sink is secured to the printed circuit board, since the LSI package is sandwiched between the heat sink and the printed circuit board, it is necessary that some contrivance to accommodate variations in a height of the LSI package is provided.

Variations in the height readily occur among the mounted LSI packages and reasons for the variations in the height of the LSI package are various. For example, in the case of a surface-mounting type LSI package such as a BGA (Ball Grid Array) or a like, variations in thickness of solder balls arranged in a grid-like form readily occurs among lots and, in the case of face-down bonding, variations occur easily, or also in an insertion-mounted type package, variations occurs readily in a degree to which a lead is inserted into a hole of a land portion.

A related mounting structure of this type is disclosed in, for example, Patent Reference 1 (Japanese Patent Application Laid-open No. 2001-057405) in which a heat transmission rubber is disposed between a heat sink and an LSI package so that variations in a direction of height are accommodated by the heat transmission rubber.

Also, a related mounting structure of this kind is disclosed in, for example, Patent Reference 2 (Japanese Patent Application Laid-open No. Hei 09-139450) in which each compression coil spring is attached to each male screw serving as a securing member and is made to accommodate variations in height in a direction of an LSI package. However, thermal conductivity of the heat transmission rubber is low and highly-priced, which causes high costs of the heat sink securing structure, therefore, conventionally, the compression springs are generally used.

FIG. 5 is an exploded perspective view showing a related mounting structure (structure for securing a heat sink) of an LSI package with a heat sink using compression coil springs and disassembled securing members to be used in the mounting structure. FIG. 6 is a side view showing the related mounting structure and the securing members for the mounting structure. FIG. 7 is the mounting structure of FIG. 5 taken along the line A-A.

The related mounting structure (structure for securing heat sink) of this type roughly includes, as shown in FIGS. 5, 6, and 7, a printed circuit board 1, an LSI package 2 being surface-mounted on the printed circuit board 1, a heat sink 3 having a fin structure disposed in a thermal contact state on an upper surface of the LSI package 2, a pair of lower and upper stiffeners (lower stiffener 4 and upper stiffener 5) to support and reinforce the printed circuit board 1, and a set of securing members including screw members 6, male screws 7, shafts 8, washers and a like, and compression coil springs 10 to accommodate variations in height in a direction of the LSI package 2 (refer to Patent Reference 3 [Japanese Patent Application Laid-open No. 2000-058703] for the stiffener structure). The pair of upper and lower stiffeners 4 and 5 is made of a metal plate and is secured with the screw members 6 in a state in which the printed circuit board 1 is sandwiched between the upper and lower stiffeners. The upper and lower stiffeners are secured to each other and, therefore, an occurrence of warpage caused by heat of the printed circuit board 1 can be prevented.

The above heat sink is so configured that many dissipating fins 3b to increase contact areas (dissipation area) with an outer atmosphere are disposed on an upper surface of an heat sink base 3a in parallel to one another and in an erected manner. At four corners of the heat sink base 3a are formed through-holes 3c to insert the male screws 7. On the upper surface stiffeners 6, as shown in FIG. 7, is formed an aperture portion to allow the LSI package to be inserted. In positions corresponding to the through-holes 3c at four corners of the heat sink base 3a are attached, in a securing manner, the shafts 8 (female screws with upper portion being opened) to screw the male screws 7 therein. The LSI package 2 is so configured as to be exposed from the aperture portion 11 of the upper stiffener 5 and a flat upper surface of the LSI package 2 is in thermal contact with a bottom of the heat sink base 3a.

Each of the above male screws 7 is passed through each of washers 9, each of compression coil springs 10 and each of through holes 3c in this order and, in this state, an end of each of the male screws is screwed into each of the upper stiffener 5 and, as a result, each of the male screws 7 is screw-secured to each of the shafts. Thus, conventionally, the heat sink 3 is screw-secured to the upper stiffener 5 using the screw members and the printed circuit board 1, in a state in which the LSI package is exposed from the aperture portion 11 of the upper stiffener 5 is sandwiched between the upper stiffener 5 and the lower stiffener 4 and is secured and, therefore, in a state in which the upper surface of the LSI package 2 is in thermal contact with the bottom of the heat sink base 3a, the heat sink 3 is secured to the printed circuit board 1.

According to the above configurations, even when variations in height occurs among the LSI packages 2 due to the easy occurrence of variations in the thickness of solder balls 12 (FIG. 7) arranged in a grid form and/or the easy occurrence of variations at a time of face-down bonding, each of the compression coil springs 10 sandwiched between a head portion of each of the male screws 7 and the upper surface of the heat sink base 3a, thereby variations in height can be accommodated (FIGS. 6 and 7).

However, the above related mounting structure has a problem. That is, the height accommodating tool to secure the heat sink 3 to the printed circuit board 1 is made up of the male screws 7, the shafts (female screws) 5, the compression coil springs 10, and the washers 9 and, therefore, component counts are large, many attaching man-hours are required, thus causing complicated mounting processes. More specifically, the related method for the heat sink requires, as shown in FIG. 5, (1) a process of attaching and securing each of the shafts (female screws) 8 to the upper stiffener 5, (2) a process of securing the upper stiffeners 5 and the lower stiffener 4 by using each of the screw members 6 with the printed circuit board 1 being sandwiched between the upper and lower stiffeners, (3) a process of attaching each of the washers 9 and each of the compression coil springs 10 to each of the male screws 7, and (4) a process of securing the heat sink 3 to the printed circuit board 1 by using each of the male screws 7 with the heat sink 3 being in thermal contact with the LSI package 2, thus resulting in complicated mounting work. Additionally, the related mounting structure for the heat sink has another problem. That is, each of the male screws 7 and/or compression coil springs 10 spring out therefrom, a wind path F (FIG. 6) of a fan (not shown) is stopped up, thus resulting in lowering of the dissipation efficiency.

SUMMARY OF THE INVENTION

In view of the above, it is an object of the present invention to provide a mounting structure for electronic components and securing members which are capable of readily accommodating variations in the height of electronic components at a time of mounting, of securing a heat sink safely and reliably, of reducing securing component counts, and of improving dissipation characteristics.

According to a first aspect of the present invention, there is provided a mounting structure with a heat sink for at least one electronic component including:

a board on which the at least one electronic component is mounted;

a first supporting member on which the board is mounted;

a second supporting member mounted on an upper surface of the board and to be secured, by using a least one first securing member, to the first supporting member with the board being sandwiched between the first supporting member and the second supporting member; and the heat sink to cool the at least one electronic component being screw-secured to the second supporting member using at least one second securing means including a male screw member and a female screw member, wherein through-holes to let the male screw member insert and pass through are formed in the heat sink and wherein the female screw member to let the male screw member be screwed into are attached in a secured state to the second supporting member and wherein at least part of the female screw member includes an elastic member having a restoring property against tension.

According to a second aspect of the present invention, there is provided a mounting structure with a heat sink for at least one electronic component, the female securing member including:

a board on which the at least one electronic component is mounted;

a first supporting member on which the board is mounted;

a second supporting member mounted on an upper surface of the board and to be secured, by using at least one first securing member, to the first supporting member with the board being sandwiched between the first supporting member and the second supporting member; and the heat sink to cool the at least one electronic component being screw-secured to the second supporting member using at least one second securing member including a male screw member and a female screw member, wherein through-holes to let the male screw member insert and pass through are formed in the heat sink and wherein the female screw member to let the male screw member be screwed into are attached in a secured state to the second supporting member and wherein at least part of the female screw member includes an elastic member having a restoring property against tension and wherein, in a state in which the heat sink is screw-secured to the second supporting member, the elastic member is in a tensile state with a restoring force being maintained.

According to a third aspect of the present invention, there is provided a female securing member for securing one member to another member, by being secured to the one member and letting a male screw member be screwed into through through-holes formed in the other member including:

a tensile elastic portion having a specified height; and a female screw portion having a specified thickness and specified stiffness to let the male screw member be screwed into, wherein a lower surface of the tensile elastic portion is joined to the one member and wherein, when the male screw member is screwed into the female screwed portion, the tensile elastic portion comes into a tensile state with a restoring force being maintained and secures the other member to the one member.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EXEMPLARY EMBODIMENTS

Figure 1:
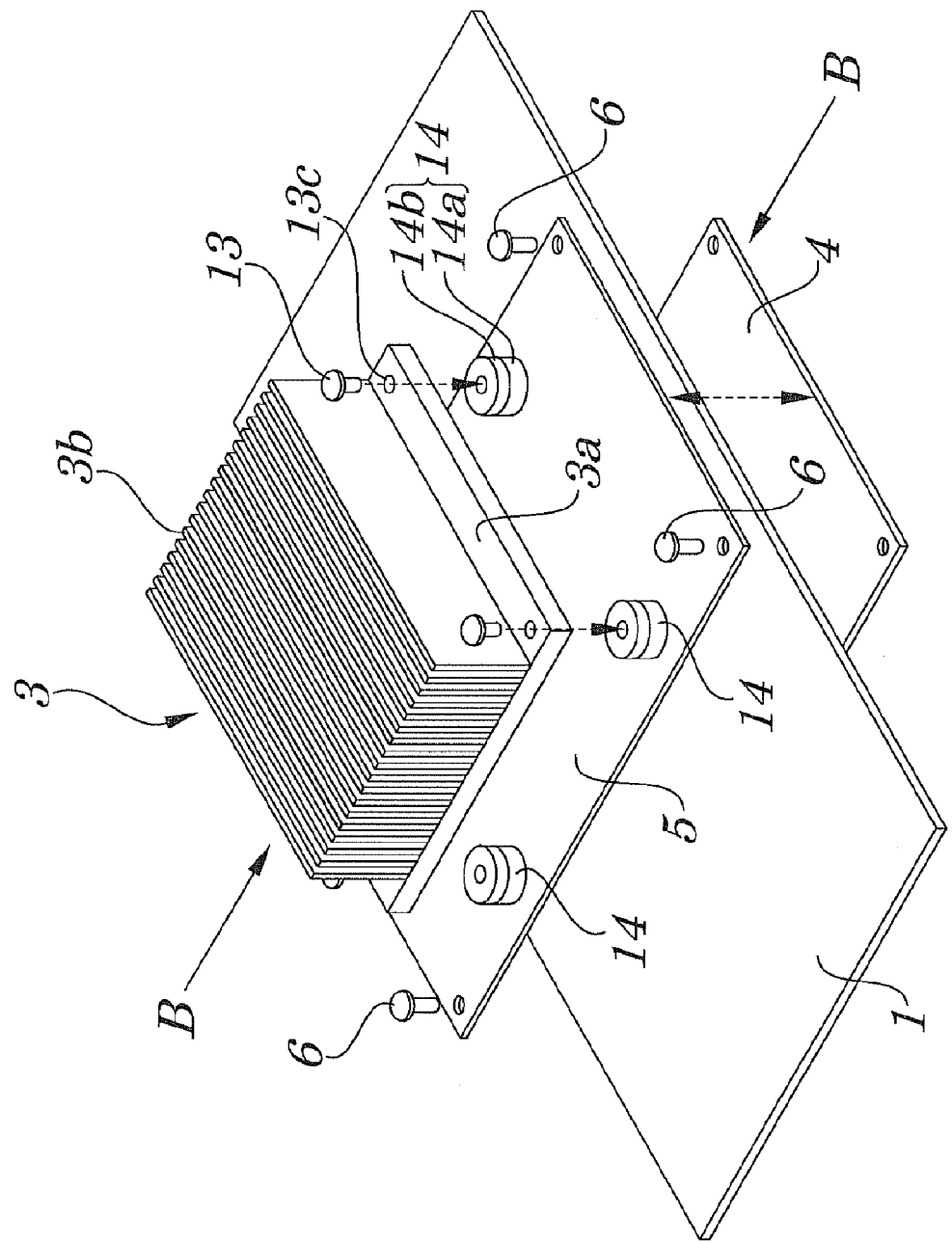
FIG. 1 is an exploded perspective view showing a mounting structure (securing structure for a heat sink) of an LSI (Large Scale Integration) package with the heat sink and showing disassembled second securing members used for the mounting structure according to a first exemplary embodiment of the present invention.

Best modes of carrying out the present invention will be described in further detail using various exemplary embodiments with reference to the accompanying drawings. The mounting structure of the present invention includes a printed circuit board 1 on which LSI packages (electronic components) are mounted, a lower stiffener (first supporting member) 4 on which the printed circuit board is disposed, an upper stiffener (second supporting member) 5 disposed on an upper surface of the printed circuit board 1 and to be secured to the lower stiffener 4 by using each of screw members (first securing member) 6 with the printed circuit board 1 being sandwiched between the upper stiffener and lower stiffener, and a heat sink 3 screw-secured by using each of male screw members (female portions of second securing members) 13 and each of female screw members (female portions of second securing members) 14 to cool the LSI packages. Each of the female screw portions is so configured that each of female screw metal fittings 14b is integrally joined to an upper surface of each of cylindrical gels 14a in a stacked state and a lower surface of each of the cylindrical gels 14a (made of the tensile elastic member) is joined to an upper surface of the upper stiffener 5.

Figure 4A:
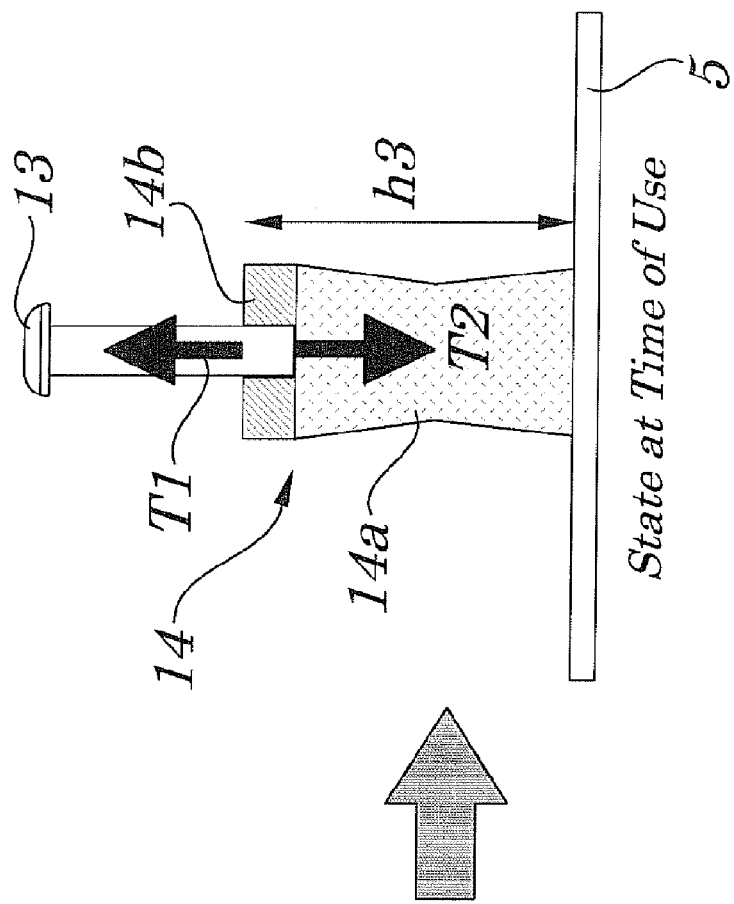
FIGS. 4A and 4B are cross-sectional views of configurations of one of the female screws and showing a state in which the screw is not yet used and is being used and 4A shows a state of being before use and 4B shows a state of being now used according to the first exemplary embodiment of the present invention.
Figure 4B:
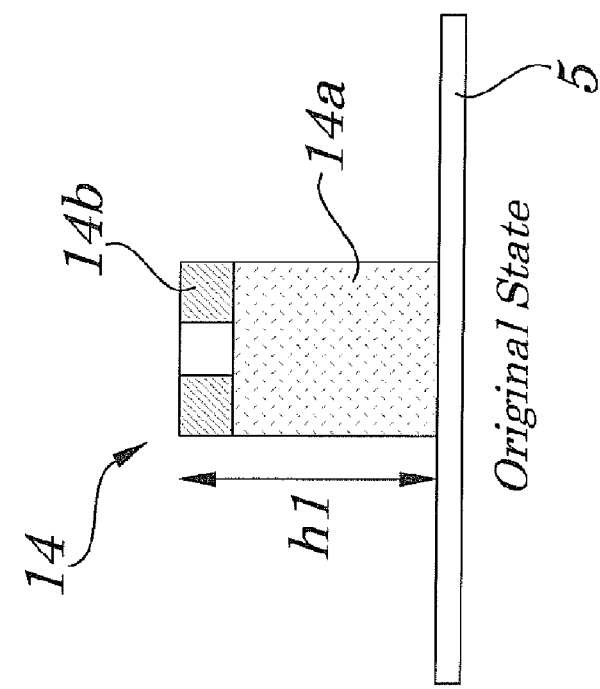

An end of each of the male screw members 13 is made to pass through each of through holes 13c of a heat sink base 3a and, in this state, the end of each of the male screw members 13, after being positioned at each of the female screw metal fitting 14b making up an upper portion of each of the female screw members 14 secured to the upper stiffener 5, is screwed into each of the female screw metal fittings 14b. With the progress of screwing into, as shown in FIG. 4B, each of the female screw metal fittings 14b is elevated, thereby causing an elongation of each of the cylindrical gels 14a by a tensile force T1. Each of the cylindrical gels 14a has a property being similar to a spring and therefore a restoring force T2 (FIG. 4B) that tries to cause the cylindrical gels 14a to return their original state occurs when being elongated and, as a result, owing to the restoring force, the heat sink 3 is pulled by each of the female screw metal fittings 14b toward the LSI packages and, on the other hand, also owing to the restoring force, the LSI packages are pulled by each of the female screw metal fittings 14b toward the heat sink 3. As a result, the heat sink 3 can impose a load K on the LSI packages, thus providing efficient thermal contact and, while the heat sink 3 is being secured by the restoring force T2 to the upper stiffener 5 (LSI packages 2), variations in the height of the LSI packages 2 are accommodated by each of the cylindrical gels 14a.

With the above configurations, the securing members (female screw portions each making up each of the second securing members) to secure the heat sink are made of the tensile elastic member and, therefore, variations in the height of electronic components occurring at a time of mounting can be reliably accommodated, thus enabling the heat sink to be secured safely and reliably and counts of components for securing to be reduced, which can improve dissipation characteristics of the heat sink and can reduce the number of man-hours for the attachment, thereby realizing easy securing of the heat sink.

Exemplary Embodiment

Figure 2:
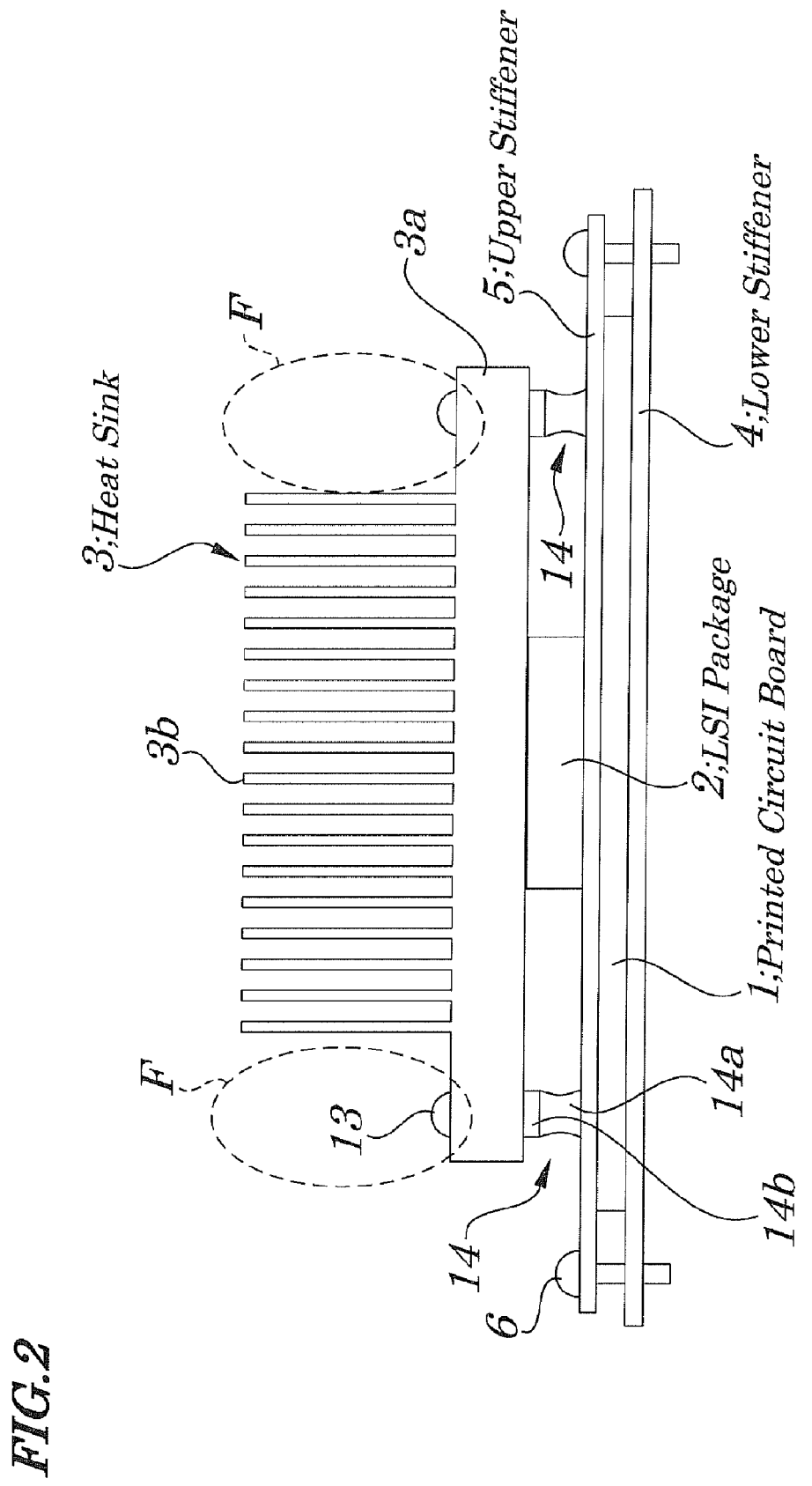
FIG. 2 is a side view schematically showing the mounting structure and the female screw portions used for the mounting structure according to the first exemplary embodiment of the present invention.
Figure 3:
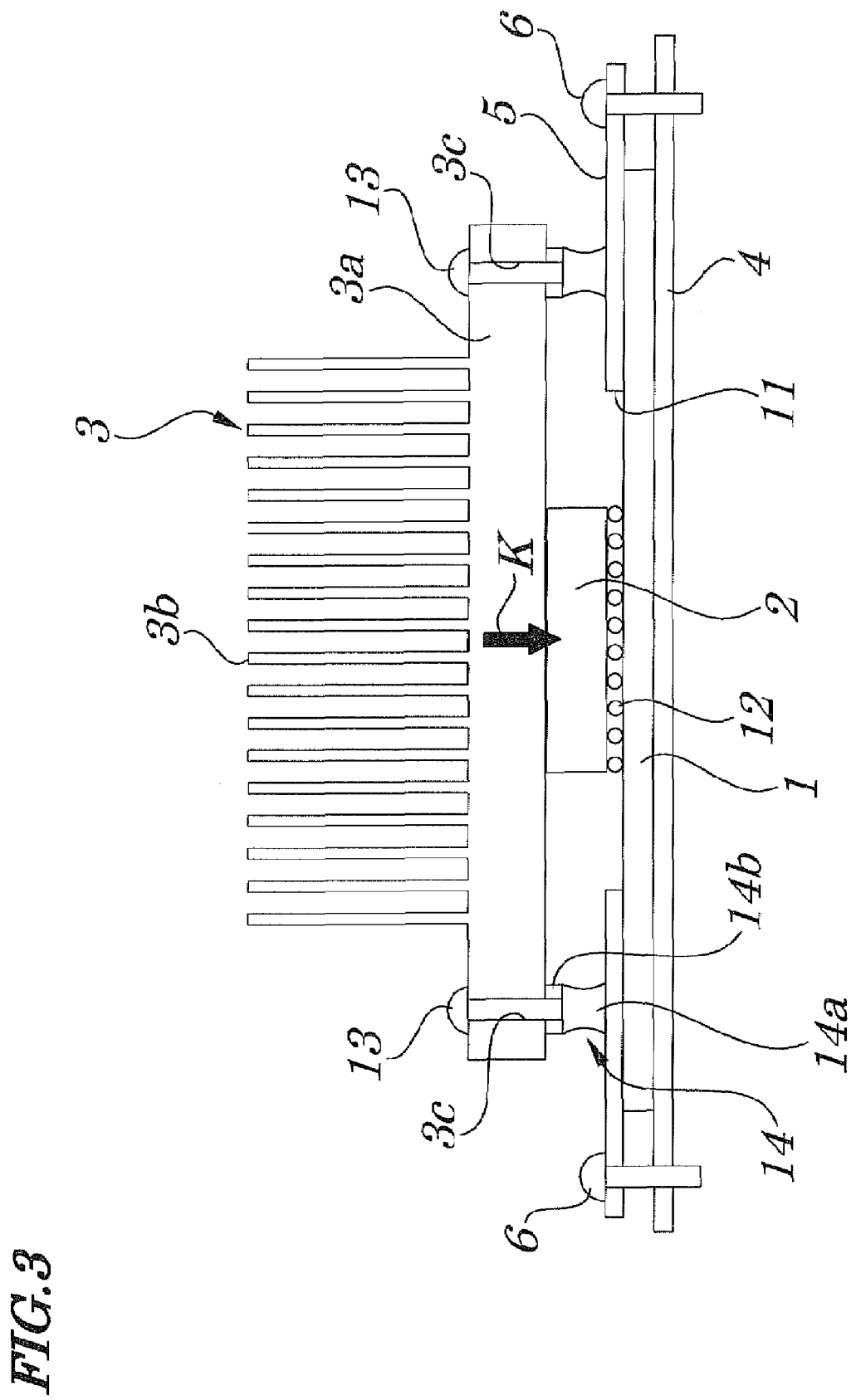
FIG. 3 is a cross-sectional view of the LSI package of FIG. 1 taken along a line B-B according to the first exemplary embodiment of the present invention.

FIG. 1 is an exploded perspective view showing a mounting structure with a heat sink (securing structure of a heat sink) for LSI (Large Scale Integration) packages and showing disassembled second securing members used for the mounting structure according to the first exemplary embodiment of the present invention. FIG. 2 is a side view schematically showing the mounting structure and the female screw portions used for the mounting structure according to the first exemplary embodiment of the present invention. FIG. 3 is a cross-sectional view of the mounting structure of FIG. 1 taken along the line B-B according to the first exemplary embodiment of the present invention. FIGS. 4A and 4B are cross-sectional views showing configurations of one of the female screws and showing a state in which the screw is not yet used and is being now used and FIG. 4A shows a state before use and FIG. 4B shows a state of being now used according to the first exemplary embodiment of the present invention;

The mounting structure (securing structure of the heat sink) for the LSI package 2 of the first exemplary embodiment differs from the related structure described above in that, unlike the related structure in which variations in the height of the LSI package 2 are accommodated by compressing compression coil springs 10 each sandwiched between a head portion of the male screw 7 and an upper surface of the heat sink base 3a, the variations in the height of the LSI package 2 (FIGS. 2 and 3) are accommodated by female screw members 14 each having a tensile property with which an upper stiffener 5 and a bottom of the heat sink base 3a are secured and each of the female screw portions is pulled on the heat sink 3 side.

Figure 5:
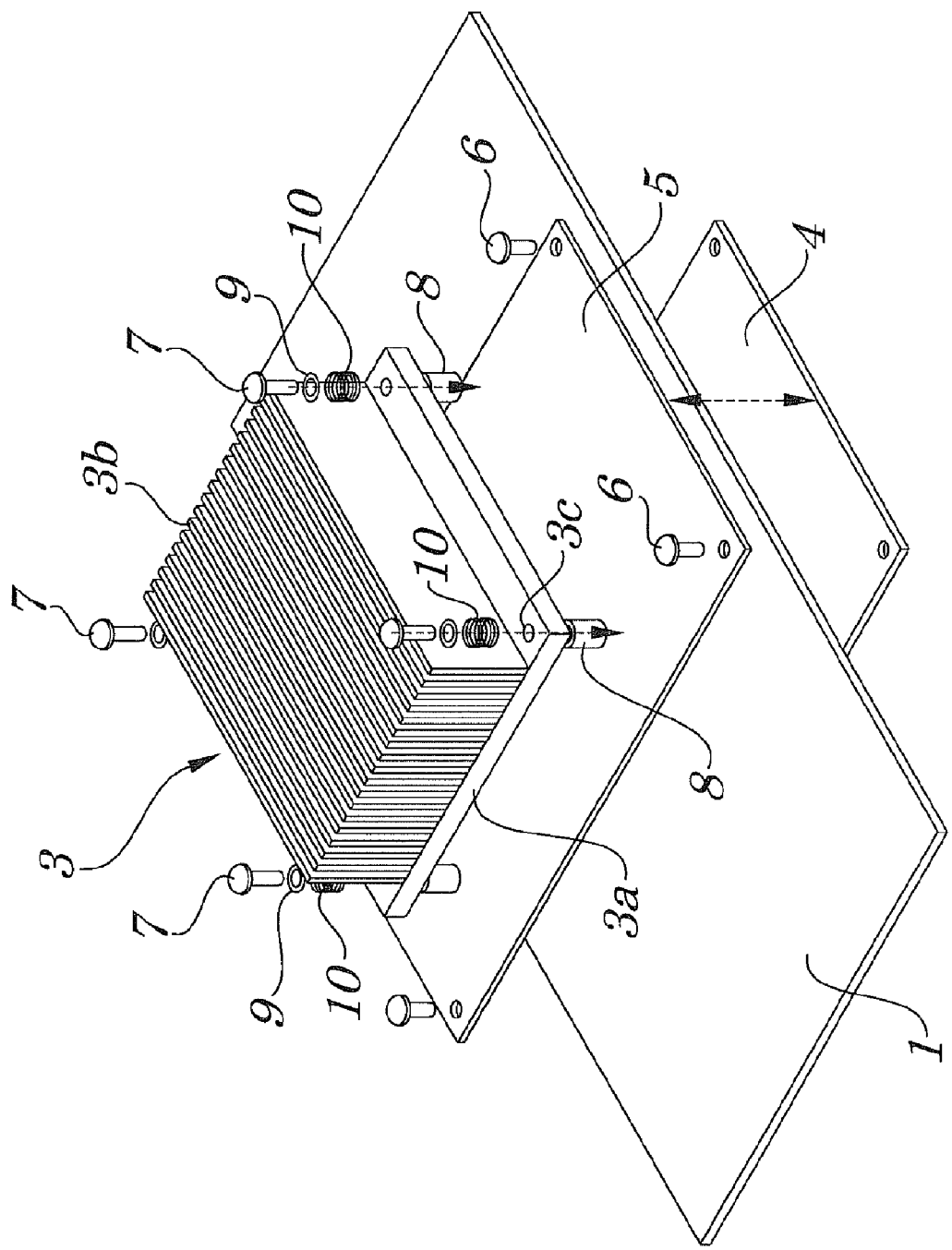
FIG. 5 is an exploded perspective view showing a related mounting structure of an LSI package with a heat sink using compression coil springs and disassembled securing members to be used in the mounting structure.
Figure 6:
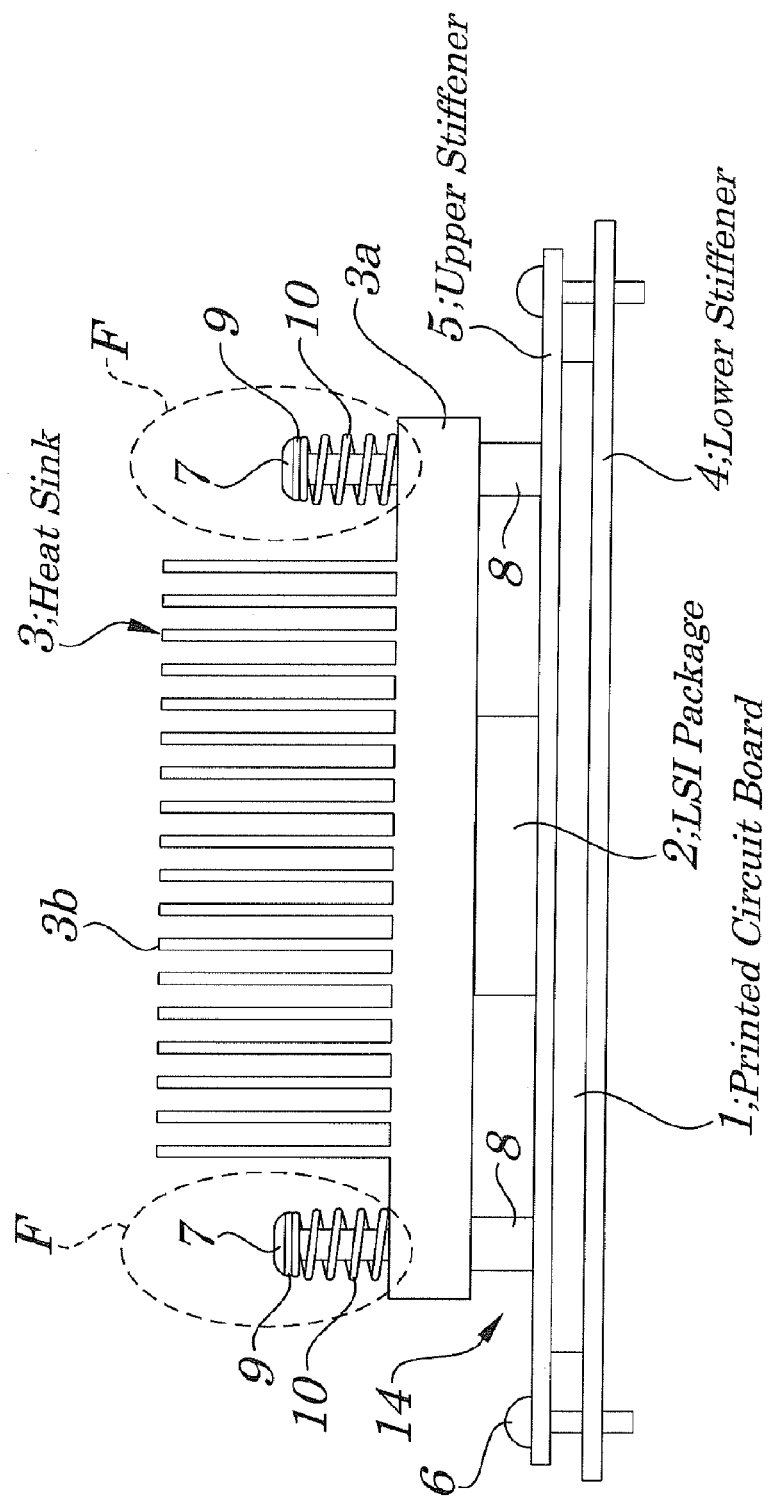
FIG. 6 is a side view showing the related mounting structure and the securing members for the mounting structure.
Figure 7:
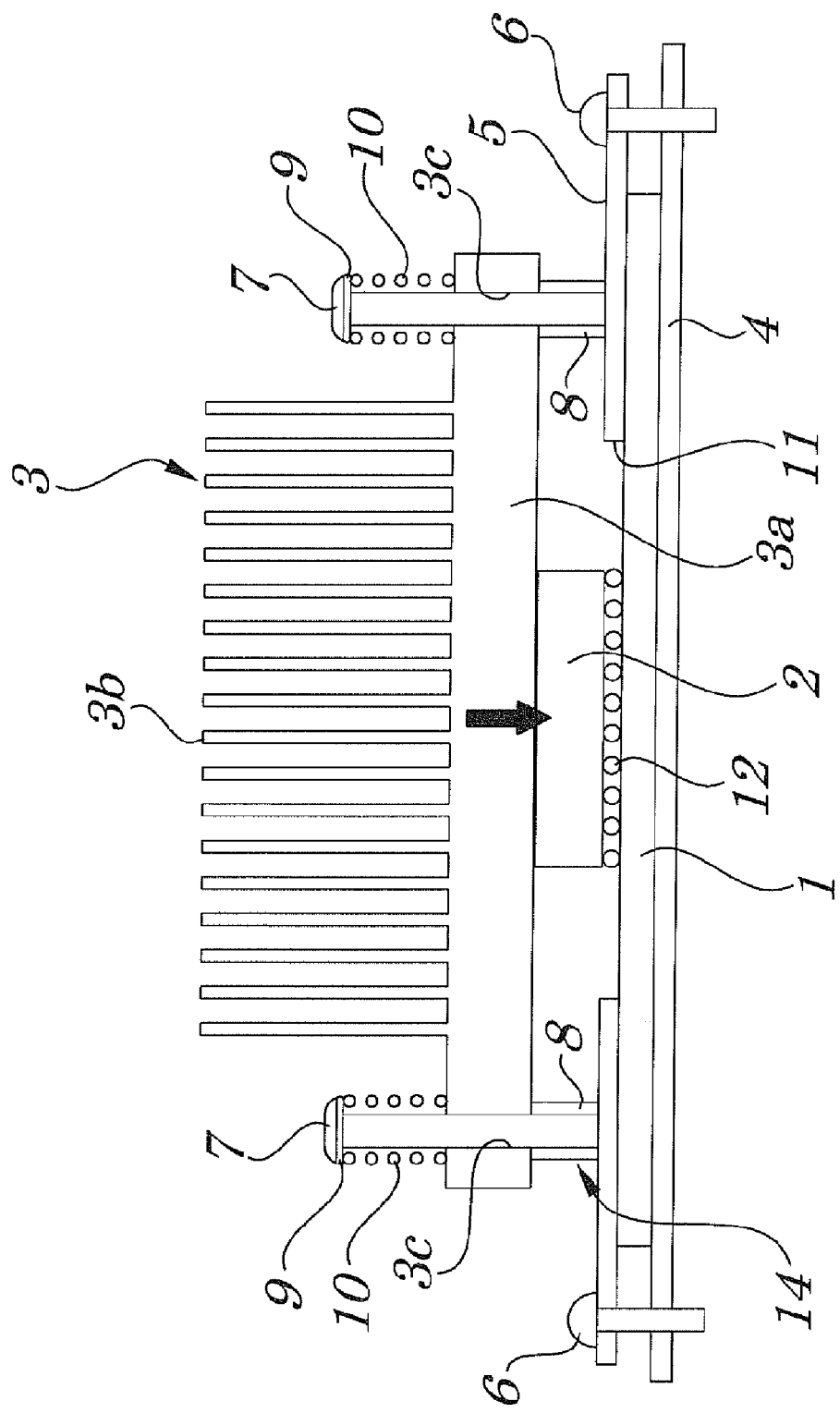
FIG. 7 is the related mounting structure of FIG. 5 taken along a line A-A.

That is, the mounting structure for the LSI package 2 (securing structure of the heat sink), as shown in FIGS. 1, 2, and 3, roughly includes a printed circuit board 1 with a thickness of 1 mm to 2 mm, an LSI package being surface-mounted on the printed circuit board 1, a heat sink 3 having a fin structure placed on a surface of the LSI package 2 in a state of thermal contact with the LSI package, a pair of lower and upper stiffeners 4 and 5 used to support and reinforce the printed circuit board 1, screw members 6, male screw members 13, and female screw members 14 each having a tensile property that can be secured by each of the male screw members 13. The pair of the lower stiffener 4 and upper stiffener 5 is made of a metal plate with a thickness of about 1 mm and is screw-secured by the screw members 6 with the printed circuit board being sandwiched between the lower and upper stiffeners 4 and 5, thereby preventing warpage caused by heat of the printed circuit board 1. Moreover, in FIGS. 1, 2, and 3, the same reference numbers are assigned to components having the same functions as those shown in FIGS. 5, 6, and 7 and their descriptions are omitted accordingly.

The above heat sink 3 is so configured that a large number of dissipating fins 3b to increase an area for contacting with an outer atmosphere are arranged in parallel in an erected manner on an upper surface of the heat sink base 3a and that through-holes 3c to insert the male screw member 13 therein are formed at four corners of the heat sink base 3a. Moreover, as shown in FIG. 3, in the upper stiffener 5, an aperture portion 11 used to let the LSI package 2 be inserted and pass therethrough is formed and the female screw members 14 each having a tensile property used to let the male screw member 13 be screwed into by passing through the through-holes 3c therein in locations corresponding to each of the four corners of the heat sink base 3a are attached in a secured state with the aid of an adhesive or a like. The LSI package 2 is so configured as to be exposed from the aperture portion 11 of the upper stiffener 5 and so that its flat upper surface is in thermal contact with a bottom of the heat sink base 3a.

Each of the above female screw members 14, as shown in FIGS. 1 to 4, includes a tensile elastic member 14a (hereafter simply a "cylindrical gel") having a solid short columnar shape made of a gel-like polymeric compound such as a resin gel, rubber gel, or a like and a female screw metal fitting 14b with a specified thickness and stiffness having a hollow short cylindrical shape used to screw the male screw member 13 therein wherein the female screw metal fitting 14b is integrally joined, in a stacked state, to an upper surface of a cylindrical gel 14a and a lower surface of the cylindrical gel 14a is joined to an upper surface of the upper stiffener 5. The cylindrical gel 14a has a property of returning to its original shape against a change in shape such as its elongation and its shrinkage (especially against the elongation) being similar to a property of a spring. The female screw metal fitting 14*b* has a screw hole with a depth sufficiently enough to screw the male screw member 13 into its central portion.

Each of the female screw portion 14 of the first exemplary embodiment is formed so that its height h1 is set to be 2 to 3 mm at no use, that is, at no load (FIG. 4A) and so as to tolerate elongation in height h3 being about 4 to 5 mm (FIG. 4B) at use time, that is, at load time in a state in which restoring force is kept.

The above dimensional conditions on each of the female screw members 14 and tolerance conditions on a change in shape for elongation are set by assuming the case where the thickness of the upper stiffener 5 is about 1 mm and variations occur in height h2 from the printed circuit board 1 of the mounted LSI package within a range of about 5 mm to 6 mm, therefore, these conditions can be applied only to the exemplary embodiment assumed as above. It is natural that, if dimensions, characteristics, and specifications of related members surrounding each of the female screw members 14 are different from one another, elastic characteristics and/or height related to the female screwed portion 14 turn out to be different accordingly.

To attach each of the female screw members 14 to the upper stiffener 5 in a securing manner, first, the cylindrical gel 14*a* is stuck to the hollow short cylindrical female screw metal fitting 14*b* using the adhesive in a securing manner to complete the assembly of each of the female screw members 14 and then each of the assembly-completed female screw members 14 is stuck to the upper stiffener 5 using the adhesive in a securing manner, however, as another method for the attachment, both the process of sticking the cylindrical gel 14*a* to the hollow short cylindrical female screw metal fitting 14*b* and the process of sticking the cylindrical gel 14*a* to the upper stiffener 5 maybe simultaneously performed, thereby enabling both the completion of the assembly of each of the female screw members 14 and the attachment of each of the female screw members 14 to the upper stiffener 5 to be completed at the same time.

An end portion of each of the male screw portions 13 passing through each of the through-holes 3*c* formed in the heat sink base 3*a* is screwed into the female screw metal fitting 14*b* so that each of the male screw members 13 is screwed into the female screw metal fitting 14*b* in a secured state. By configuring above, the heat sink 3 is secured to the upper stiffener 5 using each of the male screw members 13 and female screw portion 14. Since the upper stiffener 5 is secured using the screw members 6 to the lower stiffener 4, the printed circuit board 1 is sandwiched between the lower stiffener 4 and upper stiffener 5 with the LSI package 2 being exposed from the aperture portion 11 of the upper stiffener 5. Thus, in a state in which an upper surface of the LSI package 3 is in thermal contact with a bottom of the heat sink base 3*a*, the heat sink 3 is secured to the printed circuit board 1.

Moreover, in this exemplary embodiment, a total height of a thickness of the upper stiffener 5 and a height h1 of each of the female screw members 14 at no load time is set to be lower by about 2 mm than the height h2 from the surface of the printed circuit board 1 of the mounted LSI package even after variations in the height of the mounted LSI package is taken into consideration (however, the exemplary embodiment is not limited to the height of 2 mm). Therefore, in the exemplary embodiment, while the heat sink 3 is being secured, since each of the female screw members 14 is pulled by a load, the height h3 of the female screw portion 14 is elongated to the maximum by about 2 mm and, as a result, a restoring force that tries to cause each of the female screw members 14 to return to its original dimension occurs, thereby the heat sink 3 is secured firmly to the printed circuit board 1. At this time point, even if there are variations in the height of the mounted LSI package 2, the variations in the height can be accommodated by tensile elasticity each of the female screw members 14.

Next, by referring to FIG. 1 to FIGS. 4A and 4B, the method of securing the heat sink 3 of the first exemplary embodiment is described. A total height of the thickness of the upper stiffener 5 and the height h1 (FIG. 4A) is set to be lower by about 2 mm than the height h2 from the surface of the printed circuit board 1 of the mounted LSI package 2, even when variations in the height of the mounted LSI package 2 are taken into consideration. To attach each of the female screw members 14 to the upper stiffener 5 in a securing manner, first, the cylindrical gel 14*a* and the female screw metal fitting 14*b* are stuck, using the adhesive, to each other to complete the assembly of each of the female screw members 14 and then each of the assembly-completed female screw members 14 is secured to the upper stiffener 5 using the adhesive, or both the process of sticking the cylindrical gel 14*a* and hollow short cylindrical female screw metal fitting 14*b* and the process of sticking the upper stiffener 5 to the cylindrical gel 14*a* are simultaneously performed. Thus, the female screw portion 14 is secured to the upper stiffener 5.

Next, as shown in FIG. 1, the upper stiffener 5 is secured to the lower stiffener 4 using the screw members 6 with the printed circuit board 1 being sandwiched between the upper stiffener 5 and lower stiffener 4. This causes the printed circuit board 1 to be secured in a state of being sandwiched between the upper stiffener 5 and lower stiffener 4 with the LSI package 2 being exposed from the aperture portion 11 of the upper stiffener 5. At this time point, the LSI package 2 has been already mounted on the printed circuit board 1. Moreover, as described above, each of the female screw members 14 is attached to the upper stiffener 5.

Then, an end of each of the male screw members 13 is made to pass through each of the through-holes 3*c* of the heat sink base 3*a* and, while this state is being kept, the end of each of the male screw members 13 is positioned to the female screw metal fitting 14*b* making up an upper portion of each of the female screw members 14 secured firmly to the upper stiffener 5 and then is made to be screwed into the female screw metal fitting 14*b*. With the progress of screwing therein, as shown in FIG. 4B, each of the female screw metal fittings 14*b* is elevated and, as a result, each of the cylindrical gels 14*a* is elongated by tensile force T1. At this time point, each of the female screw members 14 is elongated from the height h1 at no load time (FIG. 4A) to a height h3 (FIG. 4B) at which an upper surface of each of the female screw metal fittings 14*b* comes into contact with a bottom of the heat sink base 3*a*. Each of the cylindrical gels 14*a* has a property being similar to a spring and, therefore, a restoring force T2 occurs (FIG. 4B) which causes the cylindrical gel 14*a* to try to return its original state after being elongated and the heat sink 3 to be pulled by each of the female screw metal fittings 14*b* toward a direction of the LSI package 2. On the other hand, the restoring force T2 causes the LSI package 2 to be pulled by each of the female screw metal fittings 14*b*. As a result, the heat sink 3 and LSI package 2 can impose loads on each other, thereby enabling highly efficient thermal contact. Moreover, while the heat sink 3 is secured, by the restoring force T2, to the upper stiffener 5 (LSI package 2), each of the cylindrical gels 14*a* accommodates variations in the height of the LSI package 2.

According to the configurations of the exemplary embodiment, owing to the tensile elastic member (cylindrical gel 14*a*) such as a gel-like polymer employed as a material for each of the female screw members 14 securing the heat sink 3, the variations in the height of the LSI package at a time of mounting can be reliably accommodated and the heat sink can be secured safely, reliably and firmly without the use of the compression coil springs 10, washers 9, or the like conventionally used and, as a result, it is made possible to use each of short male screw members 13, which can remove an obstacle against a wind path (FIG. 2) of a fan (not shown) passing through the heat sink 3, thus resulting in improved discharge efficiency. Additionally, the component counts such as a compression coil spring, washer, or the like can be reduced, thereby decreasing the number of man-hours for the attachment which allows the heat sink to be secured easily.

While the invention has been particularly shown and described with reference to exemplary embodiments thereof, the invention is not limited to theses embodiments. It will be understood by those of ordinary skill in the art that various changes in form and details may be made therein without departing from the sprit and scope of the present invention as defined by the claims. For example, the shape of each of the female screw members 14 is not limited to a cylindrical one and may be square columnar or of any other shape. Also, in the above exemplary embodiment, the case is described where each of the female screw members 14 is made up of the tensile elastic member and the female screw metal fitting. However, not only the gel-like polymeric compound but also a rubber-like polymeric compound may be used as the tensile elastic member or a tensile spring member may be also employed. Moreover, instead of the female screw metal fitting, a resin female screw may be used.

The present invention can be applied not only to the LSI package as electronic components but also to electronic and electric parts readily generating heat at a time of operations.

What is claimed is:

1. A mounting structure with a heat sink for at least one electronic component comprising:
   a board on which the at least one electronic component is mounted;
   a first supporting member on which said board is mounted;
   a second supporting member mounted on an upper surface of said board and to be secured, by using a least one first securing member, to said first supporting member with said board being sandwiched between said first supporting member and said second supporting member; and
   the heat sink to cool the at least one electronic component being screw-secured to said second supporting member using at least one second securing means comprising a male screw member and a female screw member,
   wherein through-holes to let said male screw member insert and pass through are formed in said heat sink and wherein said female screw member to let said male screw member be screwed into are attached in a secured state to said second supporting member and wherein at least part of said female screw member comprises an elastic member having a restoring property against tension.

2. The mounting structure with the heat sink for the at least one electronic component according to claim 1, wherein said female screw member comprises said elastic member having a specified height and a female screwed portion having a specified thickness and specified stiffness to let said male screw member be screwed into wherein said female screw portion is integrally joined to an upper surface of said elastic member in a stacked state and a lower surface of said elastic member is joined to an upper surface of said second supporting member.

3. The mounting structure with the heat sink for the at least one electronic component according to claim 2, wherein said elastic member comprises a gel-like polymeric compound.

4. The mounting structure with the heat sink for the at least one electronic component according to claim 2, wherein said elastic member comprises a rubber-like polymeric compound.

5. The mounting structure with the heat sink for the at least one electronic component according to claim 2, wherein said elastic member comprises a tensile spring.

6. The mounting structure with the heat sink for the at least one electronic component according to claim 1, wherein said at least one electronic component comprises an LSI (Large-Scale Integration circuit).

7. The mounting structure with the heat sink for the at least one electronic component according to claim 1, wherein said second supporting member has an aperture portion to let said at least one electronic component be exposed to be struck and contacted with said heat sink.

8. The mounting structure with the heat sink for the at least one electronic component according to claim 1, wherein said first supporting member and said second supporting member comprise a plate-shaped metal stiffener.

9. A mounting structure with a heat sink for at least one electronic component comprising:
   a board on which the at least one electronic component is mounted;
   a first supporting member on which said board is mounted;
   a second supporting member mounted on an upper surface of said board and to be secured, by using at least one first securing member, to said first supporting member with said board being sandwiched between said first supporting member and said second supporting member; and
   the heat sink to cool the at least one electronic component being screw-secured to said second supporting member using at least one second securing member comprising a male screw member and a female screw member,
   wherein through-holes to let said male screw member insert and pass through are formed in said heat sink and wherein said female screw member to let said male screw member be screwed into are attached in a secured state to said second supporting member and wherein at least part of said female screw member comprises an elastic member having a restoring property against tension and wherein, in a state in which said heat sink is screw-secured to said second supporting member, said elastic member is in a tensile state with a restoring force being maintained.

10. The mounting structure with the heat sink for the at least one electronic component according to claim 9, wherein said female screw member comprises said elastic member having a specified height and a female screwed portion having a specified thickness and specified stiffness to let said male screw member be screwed into wherein said female screw portion is integrally joined to an upper surface of said elastic member in a stacked state and a lower surface of said elastic member is joined to an upper surface of said second supporting member.

11. The mounting structure with the heat sink for the at least one electronic component according to claim 10, wherein said elastic member comprises a gel-like polymeric compound.

12. The mounting structure with the heat sink for the at least one electronic component according to claim 10, wherein said elastic member comprises a rubber-like polymeric compound.

13. The mounting structure with the heat sink for the at least one electronic component according to claim 10, wherein said elastic member comprises a tensile spring.

14. The mounting structure with the heat sink for the at least one electronic component according to claim 9, wherein said at least one electronic component comprises an LSI (Large-Scale Integration circuit).

15. The mounting structure with the heat sink for the at least one electronic component according to claim 9, wherein said second supporting member has an aperture portion to let said at least one electronic component be exposed to be struck and contacted with said heat sink.

16. The mounting structure with the heat sink for the at least one electronic component according to claim 9, wherein said first supporting member and said second supporting member comprise a plate-shaped metal stiffener.

* * * * *